United States Patent [19]

Ishida

[11] Patent Number: 5,144,360
[45] Date of Patent: Sep. 1, 1992

[54] THERMAL FIXING DEVICE IN AN IMAGE RECORDING APPARATUS

[75] Inventor: Kazuhito Ishida, Nagoya, Japan

[73] Assignee: Brother Kogyo Kabushiki Kaisha, Nagoya, Japan

[21] Appl. No.: 633,989

[22] Filed: Dec. 26, 1990

[30] Foreign Application Priority Data

May 10, 1990 [JP] Japan .................. 2-48985[U]

[51] Int. Cl.⁵ .............................................. G03B 27/52
[52] U.S. Cl. ...................................................... 355/27
[58] Field of Search .................... 355/27, 28, 290, 295

[56] References Cited

U.S. PATENT DOCUMENTS 4,305,768 12/1981 Lontz ................................ 355/77 X
4,954,845 9/1990 Yano et al. .......................... 355/290
4,996,553 2/1991 Takagi .................................. 355/27

Primary Examiner—L. T. Hix
Assistant Examiner—D. Rutledge
Attorney, Agent, or Firm—Oliff & Berridge

[57] ABSTRACT

A thermal fixing device mounted in an image recording apparatus, includes a presser-roller automatically moved away from a heat roller when a predetermined period of time or more elapses after completion of the thermal fixing of a recording medium, on or before a subsequent recording medium is fed, thus avoiding the continuity of a state in which a thermal fixing belt for feeding the recording medium is interposed and pressed between the heat roller and the presser-roller over a long period of time. Accordingly, this thermal fixing device enables the prevention of deformation in the thermal fixing belt by heat and pressure and achieves stable use of the thermal fixing belt.

16 Claims, 5 Drawing Sheets

THERMAL FIXING DEVICE IN AN IMAGE RECORDING APPARATUS

BACKGROUND OF THE INVENTION

1. Field of the Invention

The present invention relates to a thermal fixing device available in an image recording apparatus such as a copying machine, and more particularly to a thermal fixing device of the type wherein that a visible image formed on a recording medium (developer medium) by the chemical reaction is rendered stable by heating.

2. Description of the Related Art

In one conventional image recording apparatus, a recording medium is of a transfer type which uses a photosensitive microcapsule sheet and a developer sheet. More specifically, when using the transfer type recording medium, the developer material is coated on a separate substrate to provide a separate developer sheet or copy sheet. The photosensitive microcapsule sheet is provided with microcapsules which encapsulate therein a chromogenic material or dye precursor having first and second phases dependent on light exposure. The developer sheet is provided with a developer material which provides an output image upon reaction with the chromogenic material. Such an image recording medium is disclosed in, for example, U.S. Pat. No. 4,399,209.

As is well known, image recording apparatuses which use the transfer-type of recording media irradiate an original with light and a light reflected from the original or transmitted therethrough passes through an optical system such as a reflection mirror, a filter and lenses, and is focused onto the photosensitive microcapsule sheet. As a result, a latent image is formed on the photosensitive microcapsule sheet upon photocuring of the light-exposed microcapsules. Then, the light-exposed photosensitive microcapsule sheet is superposed with a developer sheet, and these sheets are pressed together at a pressure developing unit, so that non-photocured microcapsules are ruptured to permit the chromogenic material to react with the developer material, to thereby provide an output image on the developer sheet. After the pressure developing operation, the developer sheet is delivered to a thermal fixing device where the output image is thermally fixed and a glossy output image is obtained.

This type of thermal fixing device is constructed such that a thermal fixing belt is mounted tautly between a heat roller and a tensionally-acting roller, and a presser-roller is pressed against the heat roller with the thermal fixing belt interposed therebetween, followed by the movement of a recording medium according to the rotation of the thermal fixing belt, thereby causing an image formed on the recording medium to be heated and hence fixed thereon (see Japanese Patent Laid-Open No. 2-64640 and U.S. Ser. No. 07/398,979, filed on Aug. 28, 1989).

In this conventional thermal fixing device, however, the thermal fixing belt is always nipped between the heat roller and the presser-roller and is in a state in which it is locally pressed and deformed. Thus, when the deformed state of the thermal fixing belt is maintained at the same position over a long period of time, the deformed portion thereof is no longer returned to its original state. The conventional thermal fixing device is therefore accompanied by the problems that when a tension force is applied to the thermal fixing belt upon start-up of its rotation, for example, the thermal fixing belt runs idly to thereby cause a failure in feeding a recording medium or the thermal fixing belt tends to be cut due to the stress concentration on the deformed portion.

SUMMARY OF THE INVENTION

Accordingly, it is an object of the present invention to overcome the above problems and to provide a thermal fixing device which can prevent a thermal fixing belt from being deformed at the same position over a long period of time and reliably avoid the possibility of the thermal fixing belt being cut by the stress concentration.

It is another object of the present invention to provide a thermal fixing device which permits smooth delivery of a recording medium by stable driving of a thermal fixing belt and which can achieve stable movements in the thermal fixing belt.

It is a further object of the present invention to provide a thermal fixing device enabling permanent use of a thermal fixing belt.

The above and further objects and novel features of the invention will be achieved by a thermal fixing device which comprises:

(a) a heat roller for applying heat to an image formed on a surface of a recording medium;

(b) a presser-roller disposed in such a manner that the presser-roller can be brought into contact with and moved away from the heat roller;

(c) a thermal fixing belt mounted tautly in such a manner as to pass between the heat roller and the presser-roller, the thermal fixing belt feeding the recording medium between the heat roller and the presser-roller in a state in which the recording medium is supported therebetween;

(d) signal outputting means for outputting a signal when a predetermined period of time has elapsed after passage of the image on the surface of the recording medium between the heat roller and the presser-roller and completion of its thermal fixing or when a power switch is turned off while the thermal fixing of a subsequent image is still in an unstarted state after passage of the image on the surface of the recording medium between the heat roller and the presser-roller and completion of its thermal fixing; and (e) roller separating means for separating the presser-roller from the heat roller based on the signal outputted from the signal outputting means.

In the thermal fixing device constructed as described above, when the thermal fixing belt is rotated, the recording medium is moved according to the rotation of the thermal fixing belt, thereby heating the image formed on the recording medium and fixing the same thereon. Then, when the heating/fixing operation is not initiated for a subsequent image, either when a predetermined period of time has elapsed after completion of the heating and fixing of the image or when the power switch is turned off, these states are detected, thereby moving the presser-roller from a pressed position of the thermal fixing belt to a released position thereof. Accordingly, the thermal fixing belt is not left while it is still in a pressed and deformed state at the same position over a long period of time. It is thus possible to assuredly avoid the possibility of the thermal fixing belt being cut off by the stress concentration following the application of a tension force thereto and the like at the time of a start in its rotation or the like.

BRIEF DESCRIPTION OF THE DRAWINGS

The invention will be described in detail with reference to the following drawings, wherein.

DETAILED DESCRIPTION OF THE PREFERRED EMBODIMENTS

Figure 1:
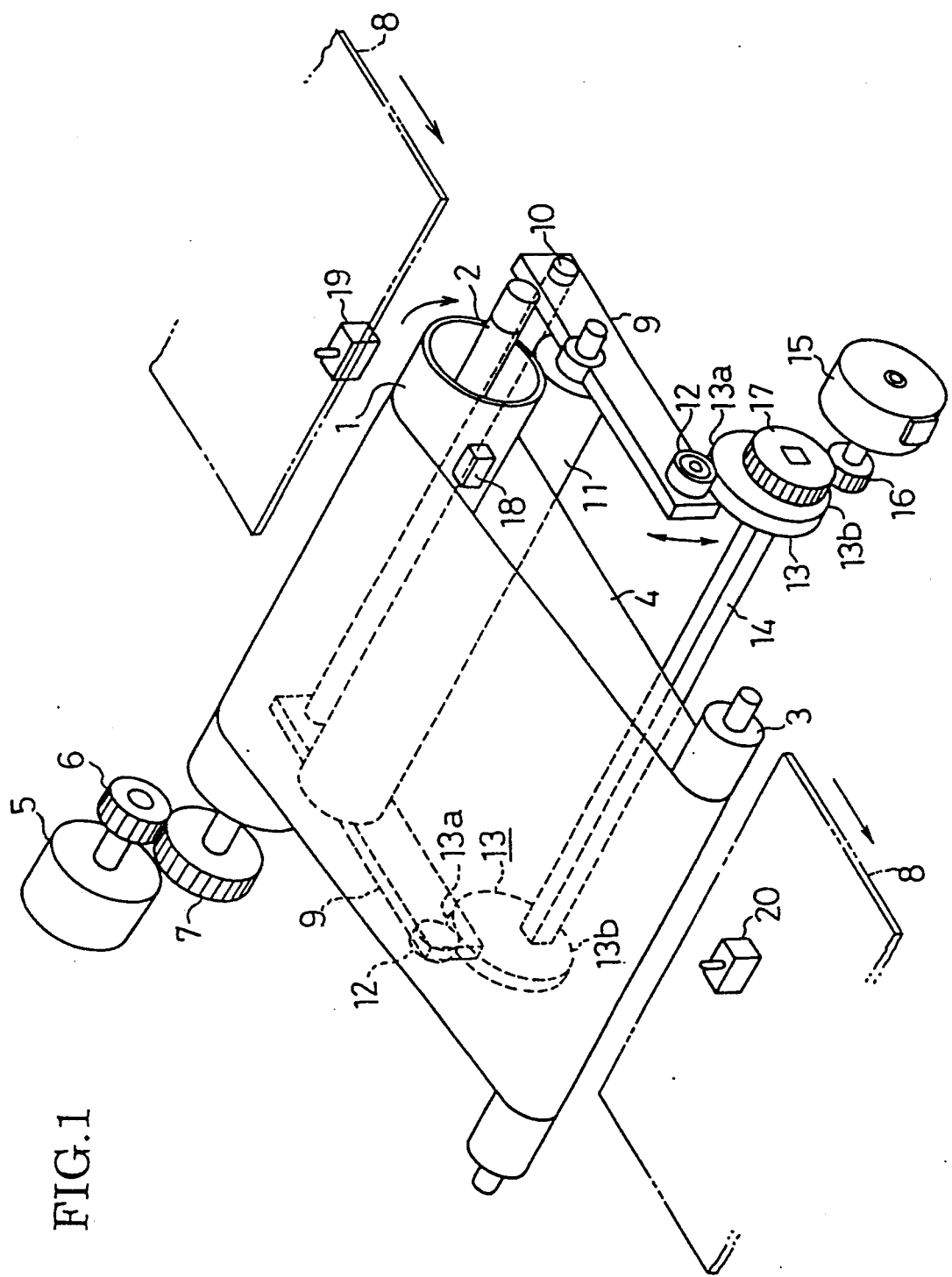
FIG. 1 is a perspective view showing one embodiment of a thermal fixing device which embodies the present invention.
Figure 2:
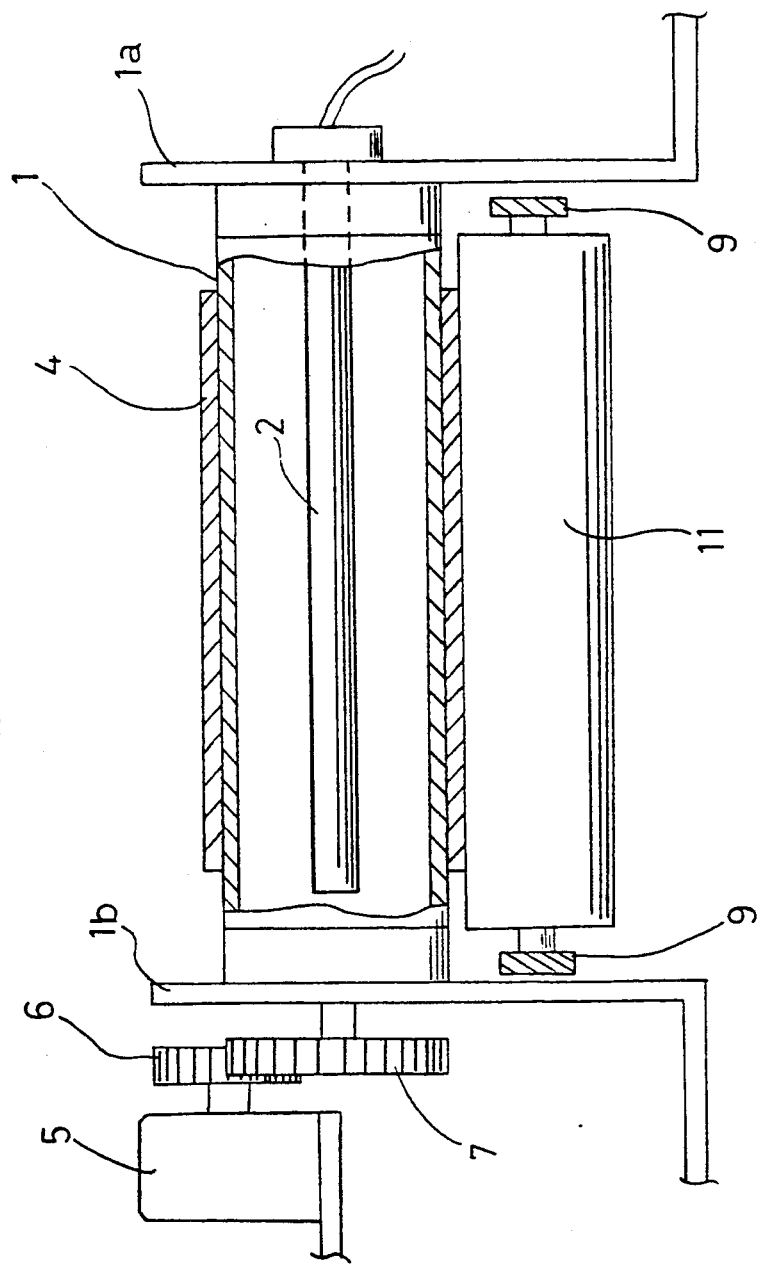
FIG. 2 is a partly diagrammatic sectional view of the device shown in FIG. 1.

A detailed description of a preferred embodiment of a color copying machine embodying the present invention will now be given with reference to the accompanying drawings. As shown in FIGS. 1 and 2, a heat roller 1 is rotatably supported on frames 1a and 1b. A heater 2 composed of a halogen lamp or the like is mounted inside the heat roller 1. A tensionally-acting roller 3 is rotatably supported on the frame about the axis parallel to the heat roller 1. An endless thermal fixing belt 4 is mounted tautly between the heat roller 1 and the tensionally-acting roller 3. Then, the heat roller 1 is rotated in a clockwise direction via gears 6, 7 according to the rotation of a belt drive motor 5. Thus, the thermal fixing belt 4 is rotated in the same direction, so that a developer sheet 8 as a recording medium on which an image is formed is conveyed.

A pair of turnable plates 9 are pivotably mounted on the frame about a support shaft 10. A presser-roller 11 is rotatably supported between the turnable plates 9, and contact rollers 12 are rotatably supported on free ends of the turnable plates 9. A pair of eccentric cams 13 are rotatably supported integrally with the frame through a connecting shaft 14 and the contact rollers 12 are brought into sliding contact with outer peripheral surfaces of the eccentric cams 13. A presser-roller moving motor 15 as a moving means such as a step motor is mounted on the frame. The motor 15 is activated to rotate the eccentric cams 13 via gears 16, 17. When large-diameter portions 13a of the eccentric cams 13 are brought into contact with the contact rollers 12, the turnable plates 9 are turned in an upper direction. As a consequence, the presser-roller 11 is positioned at a place where it is pressed against an outer peripheral lower surface of the heat roller 1 with the thermal belt 4 interposed therebetween. On the other hand, when small-diameter portions 13b of the eccentric cams 13 are brought into contact with the contact roller 12, the turnable plates 9 are turned downwardly, so that the presser-roller 11 is moved toward a position where it is released away from the thermal fixing belt 4.

A temperature sensor 18 is disposed near the outer peripheral surface of the heat roller 1, and detects the temperature heated by the heater 2 in the heat roller 1. A sheet-feed sensor 19 is disposed in a sheet-feed passage of the developer sheet 8. When the developer sheet 8 is fed between the thermal fixing belt 4 and the presser-roller 11 from the side of the heat roller 1, the sheet-feed sensor 19 outputs a detection signal. A sheet-delivery sensor 20 is disposed in a sheet-delivery passage of the developer sheet 8. When the developer sheet 8 is delivered or discharged from the lower part of the tensionally-acting roller 3 after completion of the pressure and fixing processing, the sheet-delivery sensor 20 outputs a detection signal.

Figure 3:
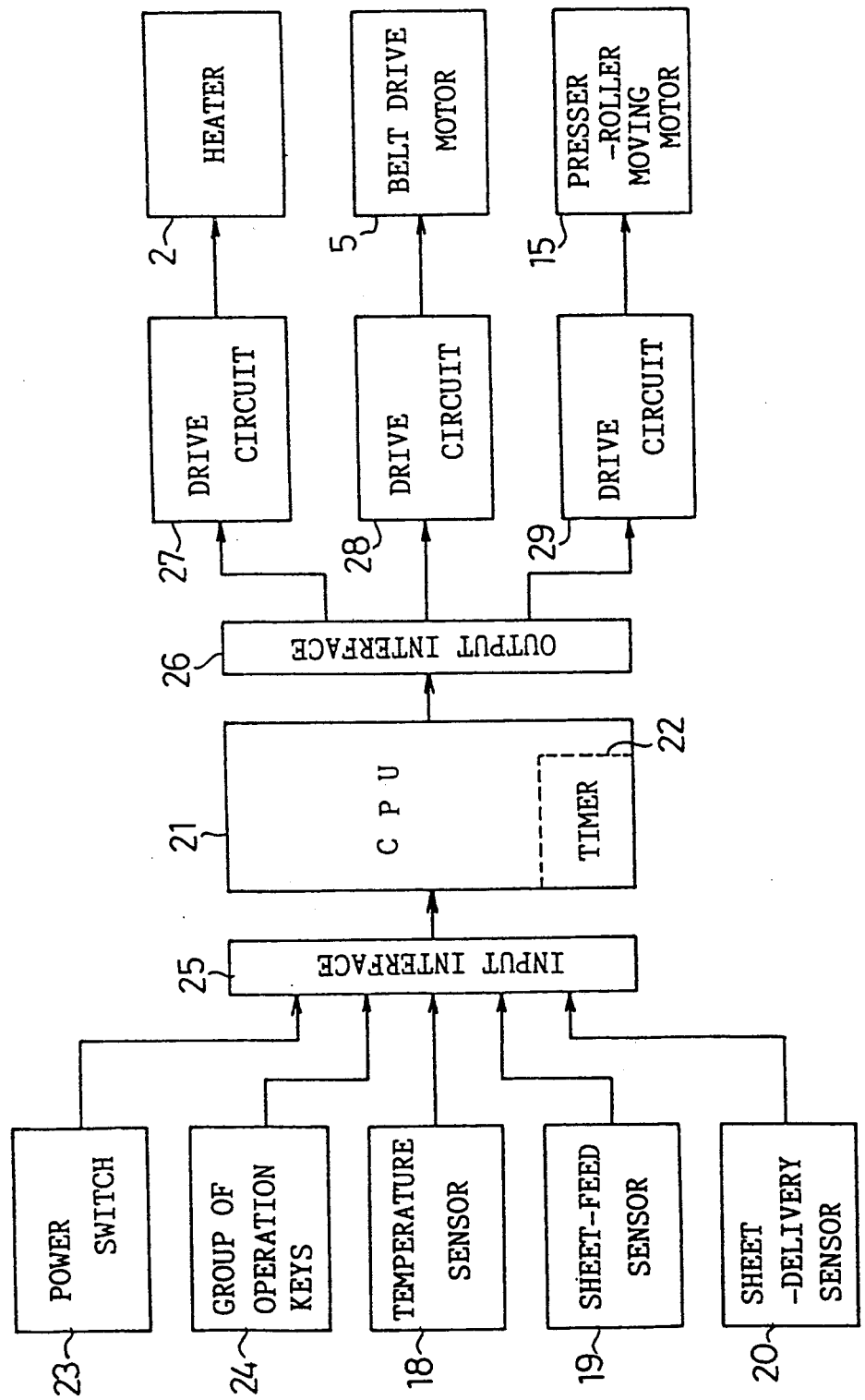
FIG. 3 is a block diagram depicting a control circuit.

A control circuit of a thermal fixing device constructed as described above will next be described with reference to FIG. 3.

A central processing unit (CPU) 21 has a timer 22 incorporated therein. Various signals are inputted to the CPU 21 through an input interface 25 from a power switch 23 used for the overall operation of a copying machine, the group of operation keys 24 including a start switch, etc., the temperature sensor 18, the sheet-feed sensor 19 and the sheet-delivery sensor 20. In addition, the CPU 21 supplies drive or stop signals to the heater 2 in the heat roller 1, the belt drive motor 5 and the presser-roller moving motor 15 through an output interface 26 and drive circuits 27 through 29.

Further, the CPU 21 has a control means, and makes a comparison between a preset temperature which has been stored as data therein in advance and a temperature detection signal, i.e., a detected temperature from the temperature sensor 18, upon heating and fixing of the developer sheet 8. Then, the CPU 21 performs on-/off control of the heater 2 in the heat roller 1 in order to cause the detected temperature to be close to the preset temperature. In addition, the CPU 21 has a detection means. When the start switch or the like out of the group of operation keys 24 is not operated during passage of a predetermined period of time produced by time-counting operation of the timer 22 or when the power switch 23 is turned off, after the heating/fixing processed developer sheet 8 is delivered or discharged and the detection signal is outputted from the sheet-delivery sensor 20, the CPU 21 detects its non-operated state and its off state to output a drive signal to the motor 15, thereby angular rotating the eccentric cams 13 by a predetermined angle. As a consequence, the presser-roller 11 is moved from a pressed position to a released position.

Figure 4:
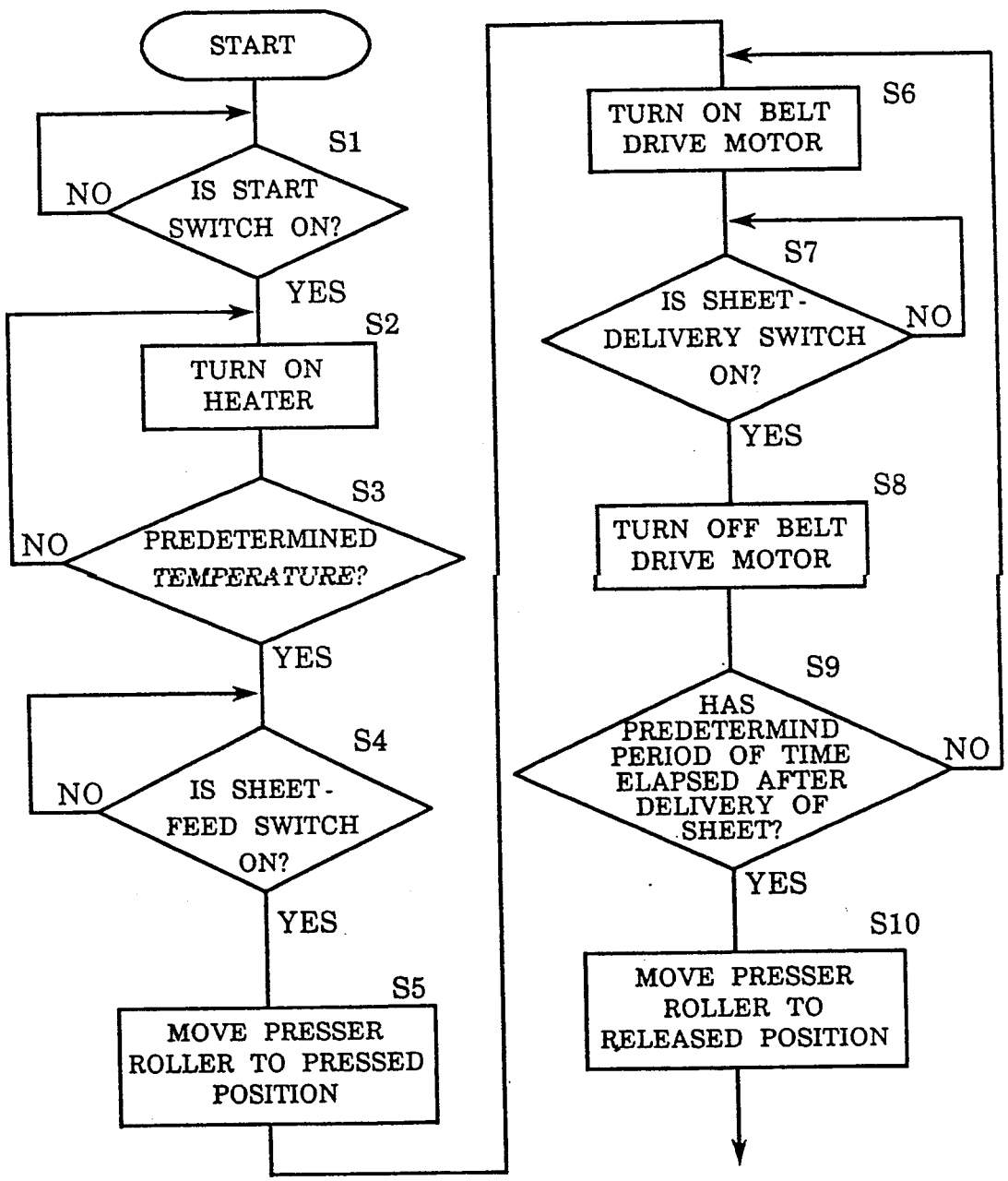
FIGS. 4 and 5 are flow charts for describing operation of the thermal fixing device.
Figure 5:
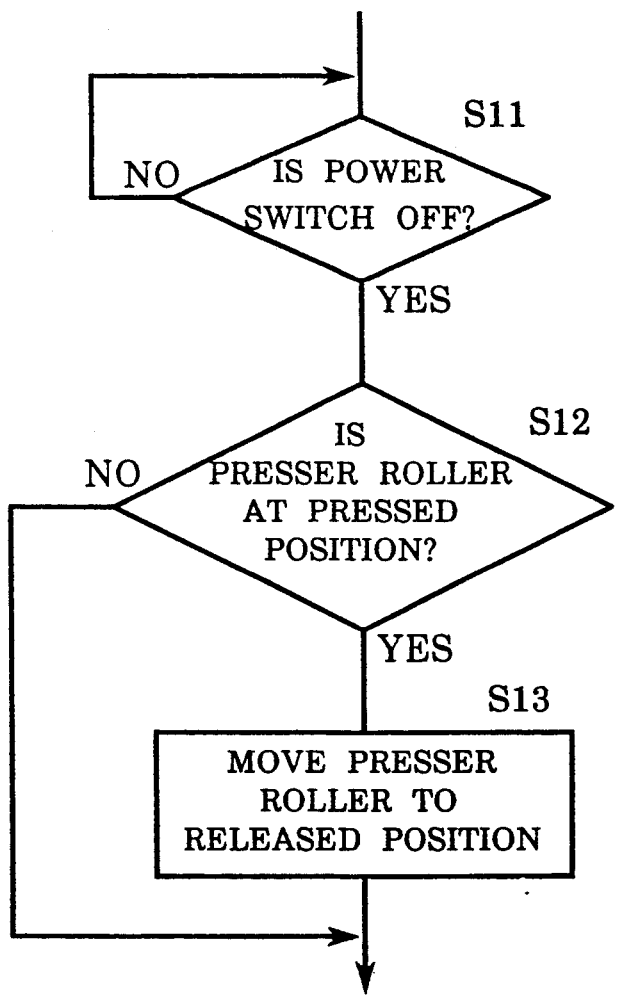

A description will be next made of operation of the thermal fixing device constructed as described above in accordance with flow charts shown in FIGS. 4 and 5.

Now, when the start switch out of the group of operation keys 24 is operated in a state in which the power switch 23 is turned on, the heater 2 in the heat roller 1 is energized. In addition, the CPU 21 makes a comparison between a preset temperature which has been stored as data therein in advance and a temperature detection signal, i.e., a detected temperature from the temperature sensor 18. Then, the CPU 21 performs on/off control of the heater 2 (Steps S1 to S3 shown in FIG. 4) to cause the detected temperature to be close to the preset temperature. When the developer sheet 8 having an image formed on its surface is fed between the thermal fixing belt 4 and the presser-roller 11, the detection signal is outputted from the sheet-feed sensor 19 and the presser-roller moving motor 15 is driven based on the detection signal. As a consequence, the eccentric cams 13 are angularly moved by a predetermined angle to thereby move the presser-roller 11 from the released position to the pressed position (Steps S4 and S5).

Subsequently, when the motor 15 is driven to be rotated, the thermal fixing belt 4 is rotated via the heat roller 1 (Step S6). As a result, the developer sheet 8 is subjected to heat from the heater 2 through the heat roller 1 and the thermal fixing belt 4 while being pressed against the thermal fixing belt 4, thereby causing a developer on the developer sheet 8 to melt. The developer sheet 8 is applied to a lower running portion of the thermal fixing belt 4, subjected to heat and fixed while being conveyed with the rotation of the thermal fixing belt 4. The thermal fixing belt 4 and the developer sheet 8 are then sufficiently cooled while the developer sheet 8 is being conveyed to a position where it is associated with the tensionally-acting roller 3. As a consequence, the developer sheet 8 thus cooled is released and discharged from the thermal fixing belt 4 by the rotation of the tensionally-acting roller 3. When the developer sheet 8 is delivered or discharged from the thermal fixing belt in this way, the sheet-delivery sensor 20 outputs a detection signal, so that the motor 5 stops based on the detection signal (Steps S7 and S8).

Where the start switch or the like out of the group of operation keys 24 is not operated following passage of a predetermined period of time produced by time-counting operation of the timer 22, after the detection signal is outputted from the sheet-delivery sensor 20, the CPU 21 detects its non-operated state and outputs a drive signal to the motor 15, thereby causing angular rotation of the eccentric cams 13 by a predetermined angle. As a consequence, the presser-roller 11 is moved from a pressed position to a released position (Steps S9 and S10). Accordingly, when the power switch 23 is in an on-state, the thermal fixing belt 4 is not left while it is still in a pressed and deformed state at the same position over a long period of time. The thermal fixing belt 4 can thus be prevented from possibly being cut off by the stress concentration following the application of a tension force thereto at the time of a start in its rotation or the like.

When the power switch 23 is turned off upon completion of a copying operation, for example, it is determined whether or not the presser-roller 11 has been located at a pressed position (Steps S11 and S12 in FIG. 5). When the presser-roller 11 is at a pressed position, the CPU 21 detects its state in the same manner as described above and outputs a drive signal to the motor 15. As a consequence, the eccentric cams 13 are rotated through a predetermined angle to thereby move the presser-roller 11 from the pressed position to the released position (Step S13). Thus, the thermal fixing belt 4 is not left while it is still in a pressed and deformed state at the same position over a long period of time, even in a state in which the power switch is turned off. The present invention thus avoids the possibility of the thermal fixing belt 4 being cut by the stress concentration following the application of a tension force thereto at the time of a start in its rotation or the like.

The present invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein. The present invention may also be embodied, for example, by changing the arrangements of respective units as needed, by providing a solenoid as a moving means for angularly moving the presser-roller 11 from the pressed position to the released position, etc. within a scope not departing from the gist of this invention.

What is claimed is:

1. A thermal fixing device in an image recording apparatus, comprising:
   a heat roller for applying heat to an image formed on a surface of a recording medium;
   a presser-roller disposed in such a manner that said presser-roller can be brought into contact with and moved away from said heat roller, thereby changing the positions of the heat roller and the presser-roller relative to each other;
   a tautly mounted thermal fixing belt, said thermal fixing belt passing between said heat roller and said presser-roller and feeding the recording medium between said heat roller and said presser-roller in a state in which the recording medium is supported between the heat roller and the presser-roller;
   signal outputting means for outputting a signal when at least one of; a) a predetermined period of time has elapsed after passage of the recording medium having the image on the surface thereof between said heat roller and said presser-roller and completion of its thermal fixation; and b) a power switch is turned off while the thermal fixation of a subsequent image is still in an un-started state after passage of the recording medium having the image on the surface thereof between said heat roller and said presser-roller and completion of its thermal fixation; and
   roller-separating means for separating said presser-roller from said heat roller based on the signal output from said signal outputting means.

2. The thermal fixing device according to claim 1, wherein said thermal fixing belt is endless, the thermal fixing device further comprising a tension roller for tautly mounting thereon said thermal fixing belt and wherein said thermal fixing belt is mounted circumferentially between said tension roller and said heat roller.

3. The thermal fixing device according to claim 2, wherein said presser-roller is provided so as to be one of away from and close to said heat roller, and said roller-separating means comprises roller support members for supporting said presser-roller thereon, cam members for moving said roller support members in such a manner that said presser-roller is moved in one of a direction to contact said heat roller and a direction away from said heat roller and a roller-separating motor for driving said cam members.

4. The thermal fixing device according to claim 2, wherein a belt drive motor for driving said thermal fixing belt is linked to said heat roller.

5. The thermal fixing device according to claim 1, wherein said heat roller has a heater incorporated therein along an axial direction thereof.

6. A thermal fixing device in an image recording apparatus, comprising:
   a heat roller for applying heat to an image formed on a surface of a recording medium;
   a presser-roller disposed in such a manner that said presser-roller can be brought into contact with and moved away from said heat roller, thereby changing the positions of the heat roller and the presser-roller relative to each other;
   a tautly mounted thermal fixing belt, said thermal fixing belt passing between said heat roller and said presser-roller and feeding a cut sheet-like recording medium between said heat roller and said presser-roller in a state in which the recording medium is supported between the heat roller and the presser-roller;

roller-separating means for separating said heat roller from said presser-roller;

a sheet-delivery sensor positioned on a side of the device at which the recording medium is delivered as it is fed between said heat roller and said presser-roller, said sheet-delivery sensor detecting a delivered state of the recording medium;

timer means operated based on a signal from said sheet-delivery sensor; and roller-separating/controlling means for driving said roller-separating means to perform the separation between said heat roller and said presser-roller when a subsequent recording medium is not delivered before a time preset by said timer means elapses.

7. The thermal fixing device according to claim 6, wherein said roller-separating/controlling means drives said roller-separating means based on a power-switch off signal when the power switch is turned off before the time preset by said timer means elapses.

8. The thermal fixing device according to claim 6, wherein said thermal fixing belt is endless, said thermal fixing device further comprising a tension roller tautly mounting thereon said thermal fixing belt and wherein said thermal fixing belt is mounted circumferentially between said tension roller and said heat roller.

9. The thermal fixing device according to claim 8, wherein said presser-roller is provided so as to be one of away from and close to said heat roller, and said roller-separating means comprises roller support members for supporting said presser-roller thereon, cam members for moving said roller support members in such a manner that said presser-roller is moved in one of a direction to contact said heat roller and a direction away from said heat roller and a roller-separating motor for driving said cam members.

10. The thermal fixing device according to claim 8, wherein a belt drive motor for driving said thermal fixing belt is linked to said heat roller.

11. The thermal fixing device according to claim 10, wherein said belt drive motor ceases driving said thermal fixing belt based on the signal from said sheet-delivery sensor.

12. A thermal fixing device for use in an image recording apparatus comprising:

a heat roller for applying heat to an image formed on a surface of a recording medium;

a presser-roller disposed in such a manner that said presser-roller can be brought into contact with and moved away from said heat roller, thereby changing the positions of the heat roller and the presser-roller relative to each other;

a tautly mounted thermal fixing belt, said thermal fixing belt passing between said heat roller and said presser-roller and adapted to feed the recording medium between said heat roller and said presser-roller in a state in which the recording medium is supported between the heat roller and the presser-roller;

signal outputting means for outputting a signal when thermal fixation is unlikely to be performed; and roller-separating means for separating said presser-roller from said heat roller based on the signal outputted from said signal output means.

13. The thermal fixing device according to claim 12, wherein said thermal fixing belt is endless, said thermal fixing device further comprising a tension roller tautly mounting thereon said thermal fixing belt and wherein said thermal fixing belt is mounted circumferentially between said tension roller and said heat roller.

14. The thermal fixing device according to claim 8, wherein said presser-roller is provided so as to be one of away from and close to said heat roller, and said roller-separating means comprises roller support members for supporting said presser-roller thereon, cam members for moving said roller support members in such a manner that said presser-roller is moved in one of a direction to contact said heat roller and a direction away from said heat roller and a roller-separating motor for driving said cam members.

15. The thermal fixing device according to claim 13, wherein a belt drive motor for driving said thermal fixing belt is linked to said heat roller.

16. The thermal fixing device according to claim 10, wherein said belt drive motor ceases driving said thermal fixing belt based on the signal from said sheet-delivery sensor.

* * * * *